United States Patent
Baur et al.

(10) Patent No.: US 8,267,561 B2
(45) Date of Patent: Sep. 18, 2012

(54) OPTOELECTRONIC HEADLIGHT, METHOD FOR PRODUCTION OF AN OPTOELECTRONIC HEADLIGHT AND A LUMINESCENCE DIODE CHIP

(75) Inventors: Johannes Baur, Regensburg (DE); Joachim Reill, Zeitlam (DE); Jörg Erich Sorg, Regensburg (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 566 days.

(21) Appl. No.: 12/295,505

(22) PCT Filed: Mar. 20, 2007

(86) PCT No.: PCT/DE2007/000519
§ 371 (c)(1),
(2), (4) Date: Mar. 17, 2009

(87) PCT Pub. No.: WO2007/115523
PCT Pub. Date: Oct. 18, 2007

(65) Prior Publication Data
US 2009/0180294 A1   Jul. 16, 2009

(30) Foreign Application Priority Data
Mar. 31, 2006   (DE) .......................... 10 2006 015 117

(51) Int. Cl.
*B60Q 1/04* (2006.01)
*H01L 33/00* (2010.01)
(52) U.S. Cl. ................. 362/545; 362/84; 257/E25.02
(58) Field of Classification Search .............. 362/84, 362/800, 249.02, 459–549; 257/E25.02, 257/88, E33.001
See application file for complete search history.

(56) References Cited

U.S. PATENT DOCUMENTS

| | | | |
|---|---|---|---|
| 5,684,309 A | 11/1997 | McIntosh et al. | |
| 5,831,277 A | 11/1998 | Razeghi | |
| 6,375,340 B1 * | 4/2002 | Biebl et al. | 362/294 |
| 6,616,862 B2 | 9/2003 | Srivastava et al. | |
| 6,670,748 B2 | 12/2003 | Ellens et al. | |
| 7,239,082 B2 | 7/2007 | Bokor et al. | |
| 7,745,985 B2 * | 6/2010 | Tanimoto et al. | 362/84 |
| 2004/0041159 A1 | 3/2004 | Yuri et al. | |
| 2004/0062699 A1 | 4/2004 | Oshio | |
| 2004/0256706 A1 | 12/2004 | Nakashima | |
| 2005/0041434 A1 | 2/2005 | Yatsuda et al. | |
| 2005/0052878 A1 * | 3/2005 | Yamada et al. | 362/460 |
| 2007/0008734 A1 | 1/2007 | Bogner et al. | |
| 2007/0190290 A1 | 8/2007 | Gunther et al. | |
| 2008/0315217 A1 * | 12/2008 | Van Der Wel | 257/88 |

FOREIGN PATENT DOCUMENTS

DE    100 36 940    2/2002

(Continued)

*Primary Examiner* — Bao Q Truong
(74) *Attorney, Agent, or Firm* — Cozen O'Connor

(57) ABSTRACT

An optoelectronic headlight which emits electromagnetic radiation is specified, which has a luminescence diode chip with at least two spatial emission regions or which has at least two luminescence diode chips each having at least one spatial emission region. The headlight is suitable in particular for a front headlight for motor vehicles. The emission regions, in a plan view of a main extension plane associated with them, are shaped differently, are of different sizes and/or are not shaped rectangularly and are differently oriented. Particularly preferably, the emission regions can be driven independently of one another. Methods for production of an optoelectronic headlight and a luminescence diode chip are furthermore specified.

15 Claims, 7 Drawing Sheets

FOREIGN PATENT DOCUMENTS

| | | |
|---|---|---|
| DE | 101 47 040 | 4/2003 |
| DE | 103 53 679 | 6/2005 |
| DE | 10 2004 019 445 | 11/2005 |
| EP | 1 515 368 | 3/2005 |
| EP | 1 526 581 | 4/2005 |
| EP | 1 553 640 | 7/2005 |
| JP | 11191642 | 7/1999 |
| JP | 2004047617 | 2/2004 |
| JP | 200533194 | 2/2005 |
| JP | 2005209852 | 8/2005 |
| WO | WO 00/33390 | 6/2000 |
| WO | WO 2004/088200 | 10/2004 |
| WO | WO 2005/101480 | 10/2005 |

\* cited by examiner

OPTOELECTRONIC HEADLIGHT, METHOD FOR PRODUCTION OF AN OPTOELECTRONIC HEADLIGHT AND A LUMINESCENCE DIODE CHIP

RELATED APPLICATIONS

This is a U.S. national stage under 35 USC §371 of application No. PCT/DE2007/000519, filed on Mar. 20, 2007.

This application claims the priority of German application no. 10 2006 015 117.8 filed Mar. 31, 2006, the entire contents of both of which are hereby incorporated by reference.

FIELD OF THE INVENTION

The invention relates to an optoelectronic headlight comprising at least one luminescence diode chip which emits electromagnetic radiation. The invention furthermore relates to a method for production of an optoelectronic headlight of this type, and to a luminescence diode chip for an optoelectronic headlight of this type.

BACKGROUND OF THE INVENTION

An optoelectronic headlight is described in WO 2004/088200, for example. Said headlight has a plurality of headlight elements each having at least one luminescence diode chip, a primary optical element associated with the luminescence diode chip, and also a headlight element output. The headlight element outputs are arranged in at least two groups in such a way that their arrangement corresponds to a desired emission characteristic of the headlight. The two groups of headlight elements can be put into operation independently of one another.

SUMMARY OF THE INVENTION

It is an object of the present invention to provide an alternative optoelectronic headlight of the type mentioned in the introduction, by means of which a predetermined emission characteristic can be realized as well as possible. Another object is to provide a method for production of an optoelectronic headlight of this type and a luminescence diode chip for an optoelectronic headlight of this type.

A headlight of the type mentioned in the introduction is specified which has a luminescence diode chip having at least two spatial emission regions or which has at least two luminescence diode chips each having at least one spatial emission region. At least partial regions of the emission regions are laterally spaced apart from one another, that is to say that the emission regions do not or do not completely overlap laterally. In a plan view of a main extension plane associated with them, the emission regions are shaped differently, are of different sizes and/or are not shaped rectangularly and are differently oriented. Particularly preferably, the emission regions can be driven independently of one another.

The main extension planes of the emission regions advantageously run substantially parallel to one another. With a plurality of different emission regions which are shaped differently, or of different sizes and/or are not rectangular and are differently oriented, it is possible to realize different desired emission characteristics of the headlight for a wide variety of areas of application in a precise manner. The headlight is preferably provided for a front headlight for motor vehicles or is a spotlight provided for an illumination unit for projection applications, for example for a video projector.

Various headlight functions can advantageously be implemented with the headlight. In the case of a front headlight for motor vehicles, these are for example freeway light, city light, country road light and cornering light, which can be realized by means of a corresponding interconnection and driving of the emission regions.

The shape, size and/or orientation of the emission regions is advantageously chosen in such a way that an emission region or a plurality of emission regions together produce(s) a shape which substantially corresponds to a cross-sectional shape of a desired headlight cone. Here and hereinafter, headlight cone means an arbitrarily shaped volume through which the headlight light shines, wherein regions are excluded in which the brightness is more than one order of magnitude lower than the maximum brightness at the same distance from the headlight. Emission characteristic should be understood to mean one or more properties of the headlight cone, such as, for example, light intensity at different solid angles, bright/dark transitions or a cross-sectional shape. Cross-sectional shape means the shape of a cross section of the headlight cone in a plane perpendicular to a main emission direction of the headlight.

In accordance with one advantageous embodiment, the shape of at least one of the emission regions in a plan view of the main extension plane is not rectangular. The emission region has boundaries which run along lines, in particular, and which are oriented obliquely with respect to one another.

In accordance with one particularly preferred embodiment, the shape of at least one of the emission regions in a plan view of the main extension plane has a corner with an acute angle or with an obtuse angle. In addition or as an alternative, the shape of at least one of the emission regions in a plan view of the main extension plane has a bend with a reflex angle. A "bend" should not necessarily be understood as a sharp corner. Rather, the bend can also be rounded, for example.

Preferably, the shape of at least one of the emission regions in a plan view of the main extension plane has no axis of symmetry. With emission regions of this type it is possible to realize, in particular, headlight cones having an asymmetrical cross section and/or an asymmetrical luminescence distribution.

Expediently, adjacent emission regions are at a relatively small distance from one another in a lateral direction. The distance is advantageously less than or equal to 100 µm, preferably less than or equal to 50 µm, particularly preferably less than or equal to 20 µm. With such a small distance it is possible to realize headlight cones having a particularly homogeneous luminescence distribution. In a further embodiment, the emission regions partly overlap in a lateral direction.

In accordance with one particular advantageous embodiment, the luminescence diode chip or the luminescence diode chips is or are arranged on a carrier body and together with the carrier body covered with an electrical insulation layer. An electrical conductor track structure is formed on the insulation layer, wherein the emission regions each have at least one electrical connection pad connected to the conductor track structure. The electrical connection pads are in particular electrically conductively connected to the conductor track structure. Preferably, the connection pads are additionally also mechanically connected to the conductor track structure.

The conductor track structure can, in principle, be constructed and structured arbitrarily; in an individual case it can in particular also consist of an unstructured electrically conductive layer. Preferably, the conductor track structure comprises a plurality of conductor tracks which can either be connected to one another or additionally or alternatively be electrically insulated from one another.

A conductor track structure formed in this way for the electrically conductive contact-connection and interconnection of the luminescence diode chip or of the luminescence diode chips is particularly advantageous for headlight applications. As a result, not only does the headlight enable different emission characteristics to be realized precisely, but it can additionally also be cost-effectively electrically conductively mounted and interconnected and also provided with an optical element that can be brought very close to the emission regions. Optical elements can in particular be brought closer to the emission regions than would be possible in the case of electrical contact-connection of the luminescence diode chip or luminescence diode chips by means of one or more bonding wires.

The headlight advantageously has at least one optical element. Preferably, at least one optical element is associated with each luminescence diode chip; particularly preferably, a plurality or all of the emission regions are jointly associated with an optical element. The optical element serves for forming a beam cone having a maximum beam intensity and a minimum divergence.

Preferably, an optical element is associated with a plurality of luminescence diode chips together. This has for example the advantage of simplified mounting compared with the case where a dedicated optical element is associated with each luminescence diode chip.

It is particularly advantageous if a light input of the optical element is positioned as closely as possible to a luminescence diode chip, which is advantageously possible particularly well with the wire-free contact-connection specified since the latter, compared with a contact-connection by means of a bonding wire, can be embodied with a particularly small height. Expediently, the solid angle at which the light is emitted from the optical element is reduced by means of the optical element as close as possible to the luminescence diode chip where a cross-sectional area of the beam cone is still small. This is necessary in particular when a highest possible radiation intensity is intended to be projected onto a smallest possible area, as is the case for headlight applications or projection devices.

In accordance with one particular advantageous embodiment, in addition to the luminescence diode chip or the luminescence diode chips, an electronic component is arranged on the carrier body, which component has at least one electrical connection pad which is electrically conductively connected via the conductor track structure. Preferably, the connection pad of the component is electrically conductively connected to at least one connection pad of the emission regions via the conductor track structure. The electrical component is of a different type with respect to the luminescence diode chip or the luminescence diode chips. Of a different type means that the components differ in functional and/or structural features, in which case they can in particular fulfill different purposes, be based on different physical effects in terms of their mode of operation, have differently shaped electrical connection pads or be mountable in different ways.

In one particularly expedient embodiment, the electronic component is a passive component and/or an integrated circuit. It is preferably suitable for SMD mounting (service mountable device mounting). In addition or as an alternative, the component is suitable for mounting which comprises a use of bonding wires. In the headlight, components of this type can advantageously be electrically conductively connected at least in part on the basis of the conductor track structure instead of by means of solder or by means of bonding wires.

In the optoelectronic headlight, it is possible, in principle, for conductor tracks which are a constituent part of the carrier body in conventional headlights of this type to be partly or completely replaced by the conductor track structure applied to the insulation layer. This enables firstly an electrical mounting of components and luminescence diode chips which is technically simple to realize and secondly the use of cost-effective carrier bodies.

Advantageously, the electrical connection pad of at least one emission region is electrically conductively connected to a connection region of the carrier body via the conductor track structure.

The insulation layer particularly advantageously comprises a luminescence conversion material. By means of the luminescence conversion material, an electromagnetic radiation from a first wavelength range that is to be emitted by the component can be converted into an electromagnetic radiation from a second wavelength range. By way of example, blue radiation can be converted in part into yellow radiation in this way. Given a suitable intensity ratio of blue and yellow radiation, white light can be generated in this way. In the case of luminescence conversion of this type, it is particularly advantageous with regard to the efficiency if the insulation layer directly adjoins that surface of the emission regions which is provided for coupling out radiation.

In one expedient embodiment, the luminescence diode chip or the luminescence diode chips is or are mounted on a chip carrier which is applied on the carrier body. By using a separate chip carrier, a particularly good dissipation of heat from the luminescence diode chip can be realized for example given a suitable choice of materials. The chip carrier can also be a housing body of a luminescence diode component, wherein a complete electrical mounting of the luminescence diode chip at the chip housing is advantageously not required. Rather, it is possible for the luminescence diode chips to be electrically conductively connected only after the application of the chip carrier on the carrier body by means of the conductor track structure.

A method for production of an optoelectronic headlight which emits electroelectric radiation is specified. The method involves providing a carrier body and at least one luminescence diode chip, wherein the luminescence diode chip has at least two emission regions which, in a plan view of a main extension plane associated with them, are shaped differently, are of different sizes and/or are differently oriented in the case of an identical type of shape. Each of the emission regions has at least one electrical connection pad. The emission regions can preferably be driven independently of one another.

The luminescence diode chip is applied on the carrier body. Afterward, an insulation layer is applied to the luminescence diode chip and the carrier body. In a further method step, cutouts are formed in the insulation layer in order to uncover at least one respective electrical connection pad of the emission regions. Electrically conductive material is applied on the insulation layer in such a way that it is connected to the electrical connection pads, in order to form an electrical conductor track structure.

Expediently, the electrically conductive material is applied in the form of a layer. Depending on the embodiment and shape of the conductor track structure to be realized, said layer can subsequently be expediently structured, with the result that, in particular, it is also possible to produce conductor tracks of the conductor track structure which are electrically insulated from one another.

A further method for production of an optoelectronic headlight which emits electromagnetic radiation is specified, in which at least two luminescence diode chips are provided alongside a carrier body. The luminescence diode chips each have at least one emission region having at least one electrical connection pad. In a plan view of a main extension plane associated with them, the emission regions are shaped differently, are of different sizes and/or are not shaped rectangularly and are differently oriented.

Further method steps comprise applying the luminescence diode chip on the carrier body, applying an insulation layer to the luminescence diode chip and the carrier body, forming cutouts in the insulation layer, for uncovering at least one respective electrical connection pad of the emission regions, applying electrically conductive material to the insulation layer in such a way that it is connected to the electrical connection pads, in order to form an electrical conductor track structure. The conductor track structure can be embodied in the manner described above.

In one preferred embodiment of the methods, at least one electrical component is provided and applied on the carrier body before the insulation layer is applied. The insulation layer is applied in such a way that the electrical component is also covered partly or completely. Further method steps of this embodiment comprise forming cutouts in the insulation layer, in order to uncover the electrical connection pad of the component, applying electrically conductive material to the insulation layer in order to form an electrical conductor track structure, in such a way that the electrically conductive material is connected to the electrical connection pad of the component.

Particularly advantageously, a plurality of headlights are produced jointly and substantially simultaneously. In particular the steps of applying the insulation layer, forming cutouts and applying electrically conductive material can be carried out in a series of batch processes. A multiplicity of optoelectronic headlights can be processed in parallel in these batch processes, which is a cost-effective alternative to the use of individual processes such as are required for example in the case of bonding using bonding wires. When batch processes are used, moreover, the capital expenditure requirement for necessary operational installations can also be kept low.

The batch processes can be designed flexibly for different products. It is possible, in principle, to produce different products on one production line. This can be done either successively, after a changeover of mutually differing method parameters, or else in parallel. The method can be used in particular for the electrically conductive contact-connection and connection of components from different device classes.

Applying the insulation layer advantageously comprises applying a prefabricated layer. In addition or as an alternative, applying the insulation layer advantageously comprises applying a material for the insulation layer by printing, spraying or spin-coating. By means of these measures, applying the insulation layer can be realized in a technically simple and cost-effective manner.

In one particularly preferred variant of the method, for applying the insulation layer, firstly a precursor layer is applied to the luminescence diode chip and the carrier body. This is done for example by means of a sol-gel method, by vapor deposition or by spin-coating of a suspension. A first thermal treatment is performed, which is suitable for removing organic constituents from the precursor layer. The material is subsequently subjected to a second thermal treatment, which is suitable for densifying the precursor layer. In particular, a thin and uniform glass layer can be produced by this method.

The cutouts in the insulation layer are preferably produced by a method step comprising a laser processing. In this case, the insulation layer is removed in the regions of the cutouts to be produced using laser radiation. During a laser processing, the size, shape and depth of the cutouts can be set precisely and produced directly.

Applying electrically conductive material advantageously comprises applying a metal layer by means of a PVD method and reinforcing the metal layer by means of electrodeposition. A suitable PVD method is sputtering, for example.

As an alternative, the electrically conductive material can also be applied using a printing method, in particular a screen printing method. Furthermore, the electrically conductive material can also be produced using a spraying method or a spin-coating method.

A luminescence diode chip which emits electromagnetic radiation is specified. The luminescence diode chip has at least two emission regions which can be driven independently of one another and which, in a plan view of a main extension plane associated with them, are shaped differently, are of different sizes and/or are differently oriented in the case of an identical type of shape. The luminescence diode is particularly advantageously suitable for an application in the optoelectronic headlight.

In accordance with one particularly advantageous embodiment of the luminescence diode chip it is provided that the shape of at least one of the emission regions in a plan view of the main extension plane is not rectangular, has a corner with an acute angle or an obtuse angle, has a bend with a reflex angle and/or has no axis of symmetry.

DETAILED DESCRIPTION OF THE DRAWINGS

In the exemplary embodiments and figures, identical or identically acting constituent parts are in each case provided with the same reference symbols. The elements illustrated and also the size relationships of the elements among one another should not necessarily be regarded as true to scale. Rather, some details in the figures are illustrated with an exaggerated size in order to afford a better understanding.

Figure 1:
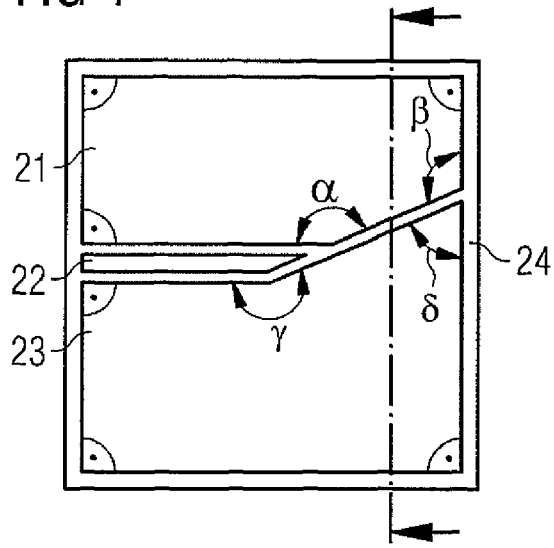
FIG. 1 shows a schematic plan view of a luminescence diode chip in accordance with a first exemplary embodiment.

The luminescence diode chip illustrated in FIG. 1 has a first emission region 21, a second emission region 22 and a third emission region 23. The emission regions are arranged on a common carrier substrate 24.

The first emission region 21 and the second emission region 23 have a pentagonal shape in the illustrated plan view of their main extension plane. The pentagonal shape of the first emission region 21 has three right angles and two obtuse angles α, β. The third emission region 23 likewise comprises three right angles. Furthermore, however, it has a reflex angle γ and an acute angle δ. An "angle of a shape of the emission region" is taken to mean an angle at which two adjacent partial straight lines of the contour of the shape are situated with respect to one another, the angle being measured inside the shape, as illustrated in FIG. 1.

The reflex angle γ is for example between 185° and 205° inclusive. Preferably, the reflex angle γ is approximately 195°.

The second emission region 22 has a quadrangular shape comprising two right angles, an acute angle and an obtuse angle. It is arranged between the first emission region 21 and the third emission region 23.

In their overall arrangement, the three emission regions 21, 22 and 23 produce a substantially rectangular, in particular a square shape. Outer sides of the emission regions 21, 22 and 23 that face one another run substantially parallel to one another. The emission regions can be put into operation independently of one another.

Figure 4:
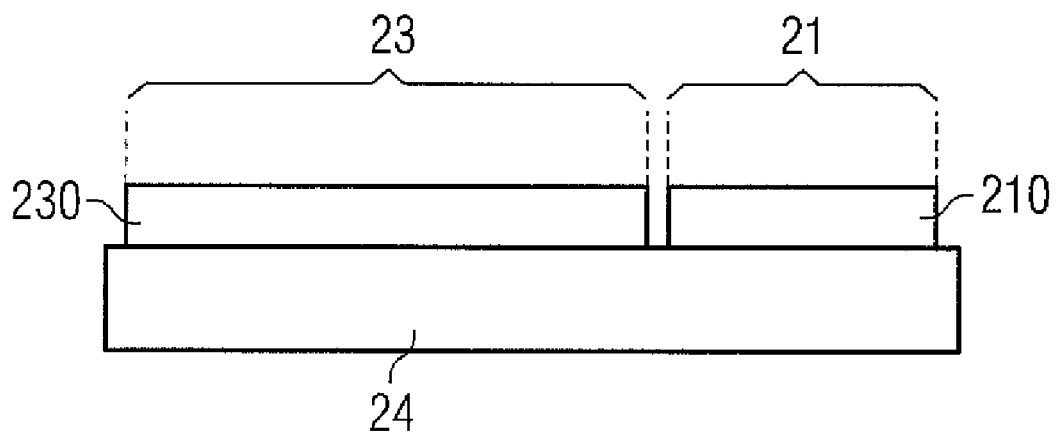
FIG. 4 shows a schematic sectional view of the luminescence diode chip illustrated in FIG. 1.

FIG. 4 illustrates a schematic sectional view on a section running along the broken line depicted in FIG. 1. As can be seen in this sectional view, the emission regions 21, 23 are formed by luminescence diode layers 210, 230. The luminescence diode layers 210, 230 are for example semiconductor layer sequences having an active zone suitable for emitting electromagnetic radiation when an electric current is applied.

The luminescence diode layers are based for example on nitride compound semiconductor materials and are suitable for emitting electromagnetic radiation from the blue and/or ultraviolet spectrum. Nitride compound semiconductor materials are compound semiconductor materials containing nitrogen, such as materials from the system $In_xAl_yGa_{1-x-y}N$ where $0 \leq x \leq 1$, $0 \leq y \leq 1$ and $x+y \leq 1$. The luminescence diode layers have e.g. at least one semiconductor layer composed of a nitride compound semiconductor material.

The luminescence diode layers can contain for example a conventional pn junction, a double heterostructure, a single quantum well structure (SQW structure) or a multiple quantum well structure (MQW structure). Such structures are known to the person skilled in the art and are therefore not explained in any further detail at this point. Examples of such MQW structures are described in the documents U.S. Pat. No. 5,831,277 and U.S. Pat. No. 5,684,309, the disclosure content of which is hereby incorporated by reference.

The luminescence diode layers 210, 230 are applied on a substrate 24. This can be a growth substrate on which the luminescence diode layers are grown in the form of a semiconductor layer sequence. As an alternative, the substrate 24 can also be a carrier substrate on which the luminescence diode layers 210, 230 were applied after their formation.

In this case, a reflector can be arranged for example between the luminescence diode layers 210, 230 and the substrate 24, said reflector reflecting electromagnetic radiation generated in the luminescence diode layers 210, 230. By way of example, a metallic or dielectric mirror can be involved in this case. Preferably, the reflector comprises a dielectric layer and a metallic layer applied on said dielectric layer, wherein the dielectric layer adjoins the luminescence diode layers 210, 230 (not shown).

The luminescence diode layers 210, 230 are spaced apart from one another. As a result, their emission regions 21, 23 can be driven independently of one another. The realization of a mutually independent drivability of different emission regions can also be effected in any other manner, however. It is also possible, for example, for the emission regions to partly overlap one another along the main extension plane associated with them, that is to say that the emission regions do not have to be arranged in regions physically separated from one another.

Partly overlapping emission regions can be achieved for example by means of current barriers which only partly prevent an electric current—which is impressed for example in a first emission region—from flowing through regions of a luminescence diode layer which is associated with a second emission region. Upon energization of the second emission region, the current barrier or the current barriers also bring about a corresponding partial shielding of the electric current. Overall, two different, but partly mutually overlapping emission regions can be realized in this way.

Figure 2:
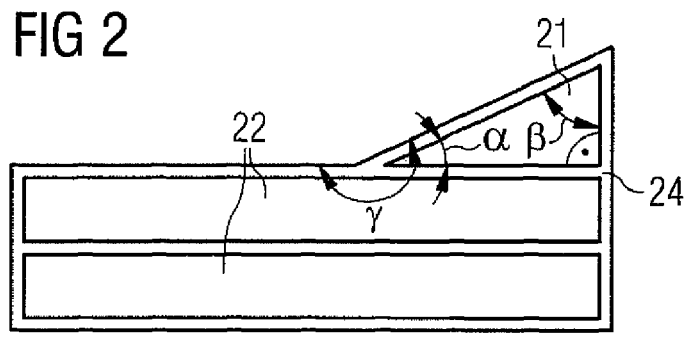
FIG. 2 shows a schematic plan view of a luminescence diode chip in accordance with a second exemplary embodiment.

The luminescence diode chip illustrated in FIG. 2 has a first emission region 21 and two second emission regions 22. The first emission region 21 has a triangular shape having a right angle and two acute angles α, β. The two second emission regions 22 have an elongated rectangular shape. They are arranged alongside one another in such a way that two of their longitudinal sides run parallel to one another and face one another. The first emission region 21 is arranged relative to the two second emission regions 22 in such a way that a pentagonal shape having a reflex angle γ is formed by the overall arrangement of the emission regions. The reflex angle γ can be configured like the reflex angle of the third emission region of the luminescence diode chip illustrated in FIG. 1.

Figure 3:
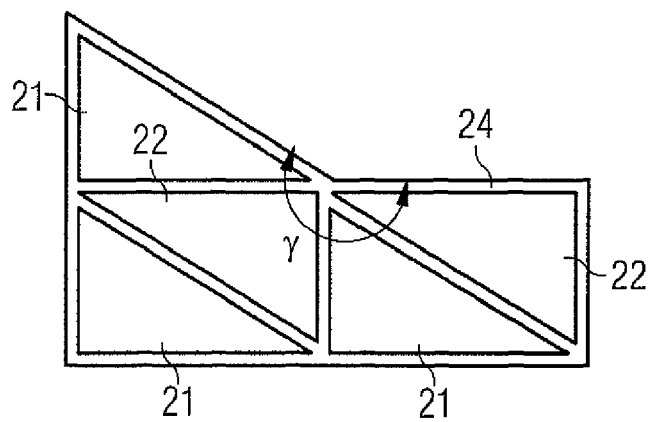
FIG. 3 shows a schematic plan view of a luminescence diode chip in accordance with a third exemplary embodiment.

The luminescence diode chip illustrated in FIG. 3 has five emission regions 21, 22 having an identical type of shape. The shapes of three first emission regions 21 have a first orientation and the shapes of two second emission regions 22 have a second orientation, wherein the first orientation is rotated through 180° relative to the second orientation parallel to the main extension plane of the emission regions.

The emission regions all have a triangular shape having a right angle and two acute angles. The overall arrangement of the emission regions again produces a pentagonal shape having a reflex angle γ which can be configured like the reflex angles γ described in the previous examples.

The luminescence diode chips illustrated in FIGS. 1 to 3 are well suited to use in a headlight module for motor vehicle front headlights. For front headlights of this type, an asymmetrical emission characteristic in which emitted headlight cones have an asymmetrical cross section with a reflex angle is prescribed in many countries.

Figure 5:
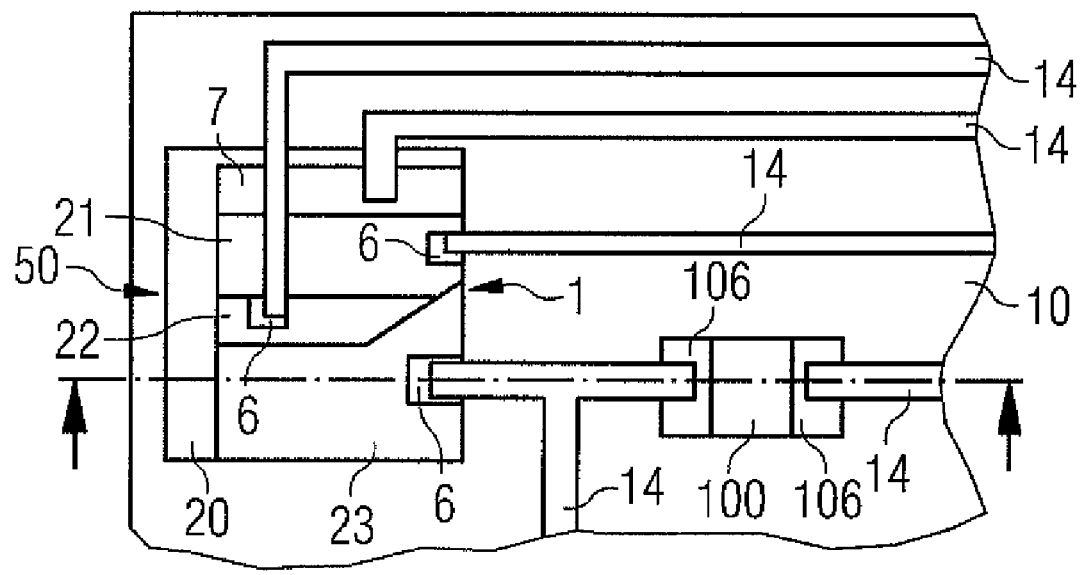
FIG. 5 shows a schematic plan view of an excerpt from an optoelectronic headlight in accordance with a first exemplary embodiment.

The optoelectronic headlight illustrated in FIG. 5 has an optoelectronic component 50 and a passive component 100. These electrical components of different types are arranged on a carrier body 10. As can be discerned in the sectional view of FIG. 13, the components 50, 100 and the carrier body 10 are covered with an electrical insulation layer 3. An electrical conductor track structure 14 is formed on the insulation layer 3. The optoelectronic component 50 and the passive electrical component 100 have electrical connection pads 7, 6, 106 connected to the conductor track structure 14.

The optoelectronic component 50 has a chip carrier 20 having an electrical connection pad 7. A luminescence diode chip 1 is applied on part of the electrical connection pad 7. Said chip has, on a side remote from the electrical connection pad 7 of the chip carrier 20, three emission regions 21, 22, 23 each having an electrical connection pad 6. These electrical connection pads 6 and that part of the electrical connection pad 7 which is not covered by the luminescence diode chip 1 form respective electrical connection pads of the optoelectronic component 50.

The passive component 100 is for example a resistor, a varistor or a capacitor. One of its electrical connection pads 106 is electrically conductively connected to the electrical connection pad 6 of the third emission region 23 of the luminescence diode chip 1 via an electrical conductor track of the conductor track structure 14. The second electrical connection pad 106 is likewise electrically conductively connected to a conductor track of the conductor track structure 14, but this conductor track does not lead directly to a connection pad of the optoelectronic component 50, but rather away from the latter.

The connection pads 6 of the first emission region 21 and of the second emission region 22 and the electrical connection pad 7—formed on the chip carrier 20—of the optoelectronic component 50 are also electrically conductively connected to a conductor track of the conductor track structure 14. The electrical connection pads 6, 7, 106 are preferably all connected both electrically conductively and mechanically directly to the conductor track structure 14.

The headlight illustrated in FIG. 5 can be produced for example with a carrier body 10 having no electrical conductor tracks or electrical connection pads. All the electrical conductor tracks of the headlight are advantageously formed for example as part of the conductor track structure 14 on the insulation layer 3.

As an alternative, it is also possible to combine the conductor track structure 14 formed on the insulation layer 3 with conductor tracks and/or connection pads of a corresponding carrier body 10, that is to say that the electrical interconnection of the components comprises both the conductor track structure 14 and conductor tracks and/or connection pads of the carrier body 10. An example of a headlight of this type is illustrated in FIG. 6.

Figure 6:
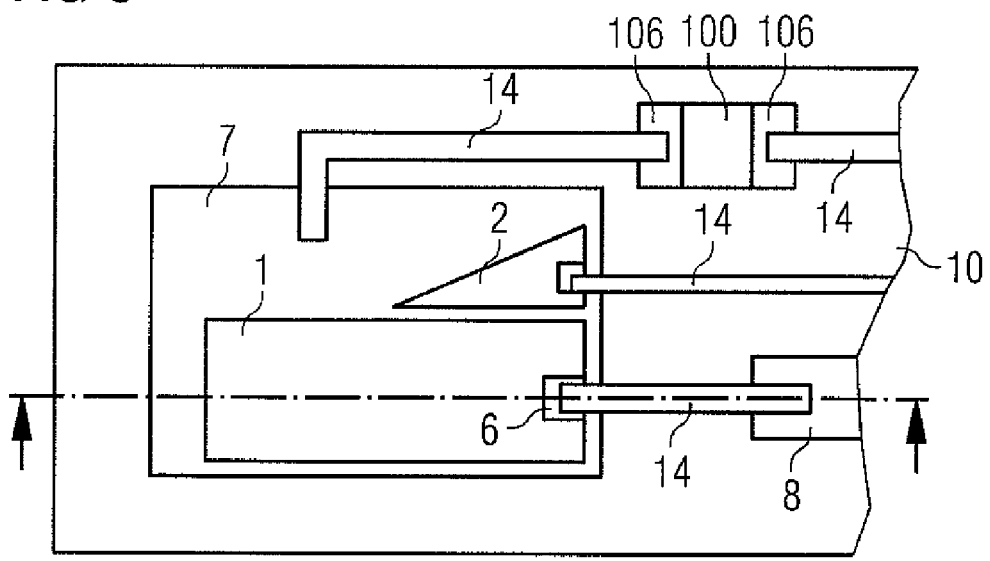
FIG. 6 shows a schematic plan view of an excerpt from an optoelectronic headlight in accordance with a second exemplary embodiment.

The headlight illustrated in FIG. 6 has a carrier body 10 having an electrical connection pad 7, on which a first luminescence diode chip 1 and a second luminescence diode chip 2 are applied. The first luminescence diode chip 1 has a single emission region having a rectangular shape in a plan view of its main extension plane. The second luminescence diode chip 2 has a single emission region having a triangular shape in a plan view of its main extension plane. The distance between the luminescence diode chips is e.g. approximately 20 μm.

The sides of the luminescence diode chips 1, 2 facing the electrical connection pad 7 are electrically conductively connected to the connection pad 7. The sides of the luminescence diode chips 1, 2 remote from the electrical connection pad 7 each have an electrical connection pad 6 which is electrically conductively connected to a conductor track of the conductor track structure 14. The connection pad 6 of the first luminescence diode chip 1 is electrically conductively connected to an electrical connection region 8 of the carrier body 10 via the conductor track structure.

A further conductor track of the conductor track structure 14 connects the electrical connection pad 7 to a connection pad 106 of a passive component 100 likewise situated on the carrier body 10. This passive component 100 has two electrical connection pads 106, wherein the second electrical connection pad is also electrically conductively connected to a conductor track of the conductor track structure 14.

It is possible, for example, for the conductor track structure 14 to have no conductor tracks that directly electrically conductively connect electrical connection pads of components of the headlight to one another.

A plurality of luminescence diode chips can preferably be used in the case of the excerpts from a headlight which are illustrated in FIGS. 5 and 6. By way of example, between 4 and 10 luminescence diode chips inclusive are contained. As an alternative, the headlight has for example between 4 and 10 optoelectronic components inclusive, each containing at least one luminescence diode chip 1.

In headlights of this type, the passive components serve for example for stabilizing the electrical voltage applied to the optoelectronic components. Varistors are expediently used for this purpose. In addition or as an alternative, further electrical components of different types with respect to the optoelectronic components 50 can be contained for any purposes such as, for example, for forming suitable electrical driving circuits in the headlight. This in particular also encompasses logic circuits which are formed using integrated circuits. By way of example, logic chips and/or memory chips can be arranged on the carrier body 10 and be electrically conductively connected to the conductor track structure 14.

Figure 7:
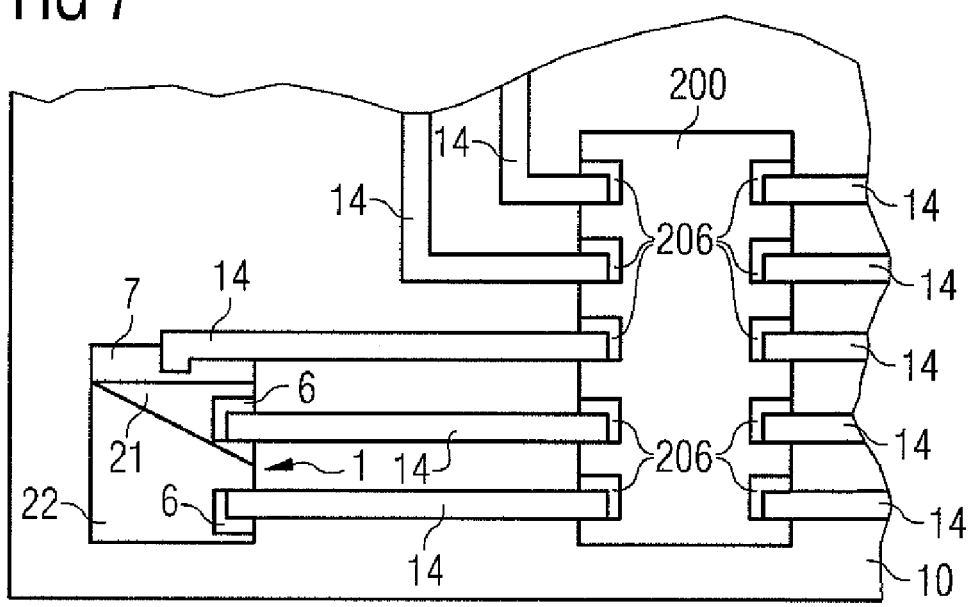
FIG. 7 shows a schematic plan view of an excerpt from an optoelectronic headlight in accordance with a third exemplary embodiment.

An excerpt from an exemplary headlight having an integrated circuit 200 is illustrated in FIG. 7. The integrated circuit 200 is provided with a housing, for example, and suitable for being mounted and connected in a manner similar to an SMD component. In addition or as an alternative, it is also possible to use integrated circuits without a housing ("bare dies"). Such bare dies are generally mounted mechanically by means of adhesive bonding or soldering and are electrically conductively connected by means of a wire bonding process. Furthermore, it is also possible to use integrated circuits which are suitable for being connected by means of bump mounting.

In the case of the headlight illustrated in FIG. 7, an integrated circuit 200 of this type is applied on the carrier body 10 and electrically conductively connected using the conductor track structure 14 applied on an insulation layer 3. By way of example, all the electrical connection pads 206 of the integrated circuit 200 are directly electrically conductively connected to conductor tracks of the conductor track structure 14.

A luminescence diode chip 1 having a first and a second non-rectangular emission region 21, 22 is applied on the carrier body 10. The first emission region 21 is triangular and the second emission region is quadrangular. They each have an electrical connection pad 6. A further connection pad 7 for the electrical connection of the luminescence diode chip is arranged alongside the chip on the carrier body 10. The electrical connections 6, 7 are electrically conductively connected to connection pads of the integrated circuit 200 via conductor tracks of the conductor track structure.

The insulation layer is not illustrated in FIGS. 5, 6 and 7 for reasons of clarity. It is arranged between the conductor track structure 14 and the other elements illustrated in the figures, wherein the insulation layer has cutouts for plated-through holes in the regions of the connection pads to be contact-connected. This construction is illustrated by the following description of exemplary methods for production of a headlight having regard to FIGS. 8 to 21.

Figure 11:
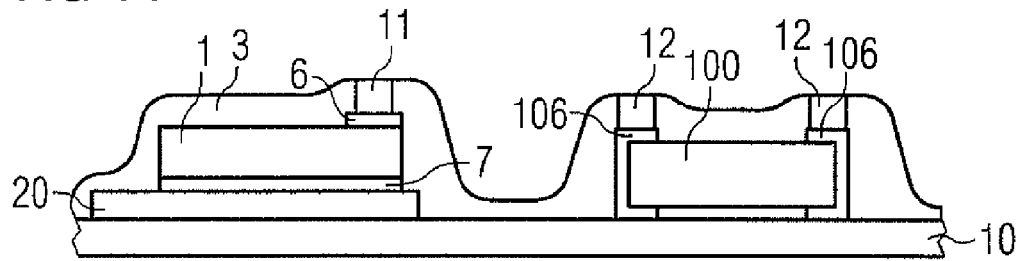
Figure 12:
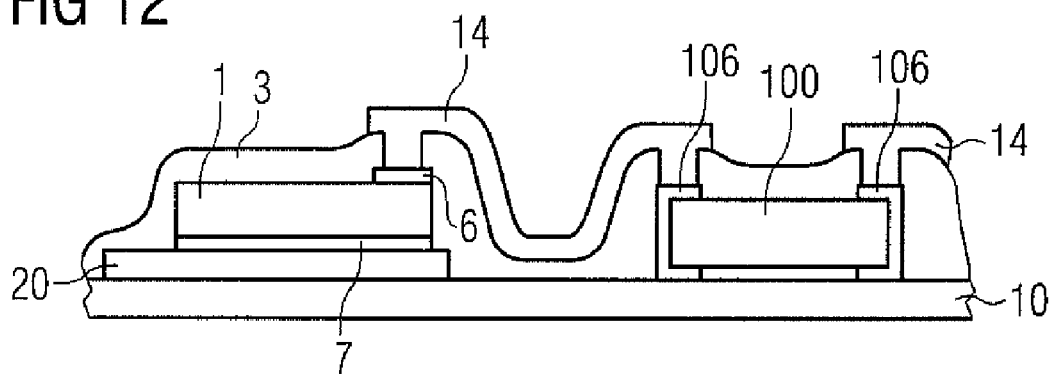
Figure 13:
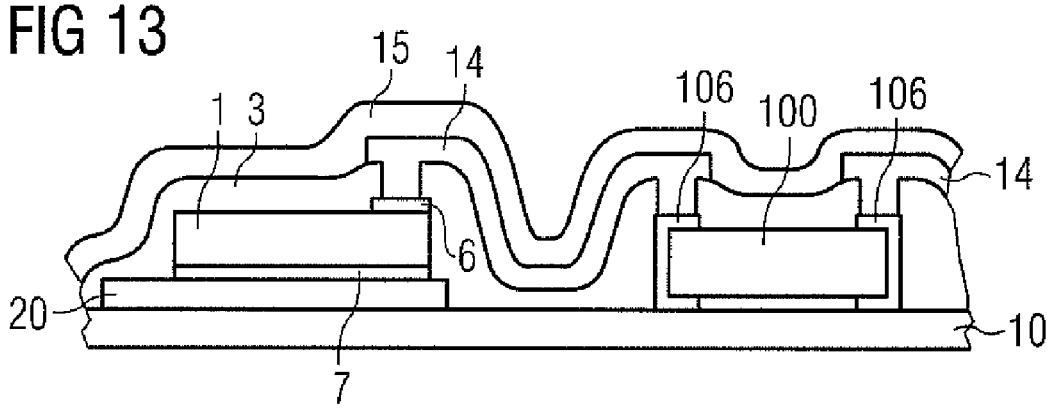

FIGS. 8 to 13 contain schematic sectional views of different method stages of an exemplary method for production of the headlight illustrated in FIG. 5. The sectional view illustrated in FIG. 13 is an illustration on a section along the broken line depicted in FIG. 5. The sectional views illustrated in FIGS. 8 to 12 are illustrations of a corresponding section during previous method stages of the exemplary method.

Figure 8:
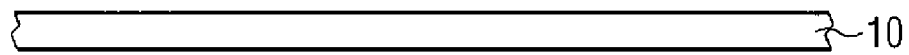
FIGS. 8 to 13 show schematic sectional views of different method stages for production of the headlight illustrated in FIG. 5 in accordance with a first exemplary embodiment of the method.

FIG. 8 illustrates the method step of providing a carrier body 10. The carrier body 10 is in the form of a planar plate, for example. As an alternative, the carrier body can also have structures and unevennesses. It contains for example a ceramic material, a plastic and/or a metal or essentially consists of one of these materials. By way of example, the carrier body consists of aluminum nitride.

Figure 9:
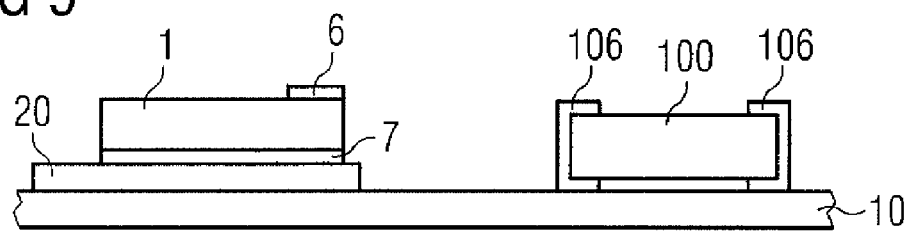

At least two electrical components 50, 100 of different types are applied to the carrier body 10, see FIG. 9. These components are expediently fixed to the carrier body 10. Although an electrically conductive linking of the components to the carrier body 10 is not necessary, a connection having a high thermal conductivity between the components and the carrier body 10 may be advantageous. The components 50, 100 are connected to the carrier body 10 for example by means of adhesive and/or by means of a solder. However, in principle a connection of this type can also be dispensed with.

One of the components is an optoelectronic component 50 comprising a chip carrier 20, an electrical connection layer 7 applied on the chip carrier 20, and a luminescence diode chip 1 applied on the electrical connection layer 7.

On its outer area facing the electrical connection layer 7, the luminescence diode chip 1 has an electrical connection pad that is electrically conductively and mechanically connected to the electrical connection layer 7 for example by means of soldering (not illustrated). On a side remote from the electrical connection layer 7, the luminescence diode chip 1 has an electrical connection pad 6. The connection pad 6 is formed for example by a contact layer or a contact layer sequence which is applied on a luminescence diode layer of the luminescence diode chip 1 and structured for example by means of photolithography.

The chip carrier 20 comprises at least one of the materials ceramic, metal and plastic or consists of one of these materials. By way of example, it consists of aluminum nitride.

A passive component 100 is applied on the carrier body 10 at a distance from the optoelectronic component 50. The component has two electrical connection pads 106 formed in such a way that the component 100 is suitable for SMD mounting. SMD stands for "surface mountable device". SMD mounting should be understood to mean a mounting which is typical of SMD components and which generally comprises applying the component to a mounting area and soldering electrical connection pads of the component to connection pads on the mounting area.

Figure 10:
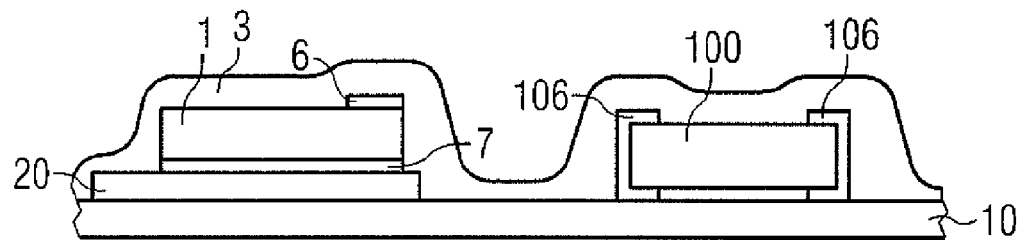

In the method stage illustrated in FIG. 10, an insulation layer 3 is applied to the electrical components 50, 100 and to the carrier body 10. The insulation layer 3 is preferably applied by spraying or spin-coating of a polymer solution. Furthermore, for example a printing method, in particular screen printing, can also advantageously be used for applying the insulation layer 3.

In the method step illustrated in FIG. 11, a first cutout 11, through which a partial region of the electrical connection pad 6 of the luminescence diode chip 1 is uncovered, and two second cutouts 12, through which in each case a partial region of the electrical connection pads 106 of the passive component 100 are uncovered, are produced in the insulation layer 3. The cutouts 11, 12 are produced for example by means of a lithographic process or by means of laser machining, laser machining being preferred.

Afterward, electrically conductive material is applied to the insulation layer in such a way that it is connected to the electrical connection pads 6, 106. Expediently, the electrically conductive material is applied in such a way that it fills the cutouts 11, 12 and covers the insulation layer 3. It is applied for forming an electrical conductor track structure 14, as illustrated in FIG. 12.

The electrically conductive material comprises for example at least one metal or consists thereof. It is applied for example in the form of a metal layer. This is done for example by vapor deposition or sputtering. The metal layer is subsequently structured, which is effected for example by means of photolithography.

As an alternative, firstly a comparatively thin metal layer, having a thickness of 100 nm, for example, is applied to the insulation layer 3 over the whole area. In regions provided for forming the conductor track structure 14, the metal layer is selectively reinforced electrolytically and subsequently etched until the unreinforced regions are removed. This is done for example by applying a photoresist layer to the metal layer, in which, by means of phototechnology, cutouts are produced in the regions provided for the conductor track structure 14 (not shown).

In the region of the cutouts in the photoresist layer, the previously applied metal layer is reinforced by an electrodeposition. This is advantageously effected in such a way that the metal layer is significantly thicker in the electrolytically reinforced layer than the metal layer previously applied over the whole area. By way of example, the thickness of the metal layer in the electrolytically reinforced region can be a number of micrometers. Afterward, the photoresist layer is removed and an etching process is carried out, which particularly removes the metal layer in regions that have not been electrolytically reinforced. In the electrolytically reinforced regions, by contrast, the metal layer is only partly removed on account of its larger thickness, with the result that it remains in these regions for forming the electrical conductor track structure 14.

As a further alternative it is also possible for the electrical conductor track structure to be applied to the insulation layer 3 directly in a structured form. This can be done for example using a printing method, in particular using a screen printing method.

As an alternative to a metal, a transparent electrically conductive material is advantageously used, for example, which is transmissive in particular to an electromagnetic radiation emitted by the luminescence diode chip 1. In particular a transparent conductive oxide (TCO) such as an indium tin oxide (ITO), for example, is suitable as an electrically conductive transparent material of this type. As an alternative, a transparent electrically conductive plastic layer is used, for example. The electrically conductive transparent material is preferably applied by vapor deposition, printing, spraying or spin-coating.

After the formation of the electrical conductor track structure 14, see FIG. 12, in an optional further method step an electrically insulating cover layer 15 can be applied to the conductor track structure, see FIG. 13. The insulating cover layer 15 is preferably a plastic layer, for example a resist layer. It covers in particular the conductor track structure 14 in order to produce a potential-free surface.

Figure 14:
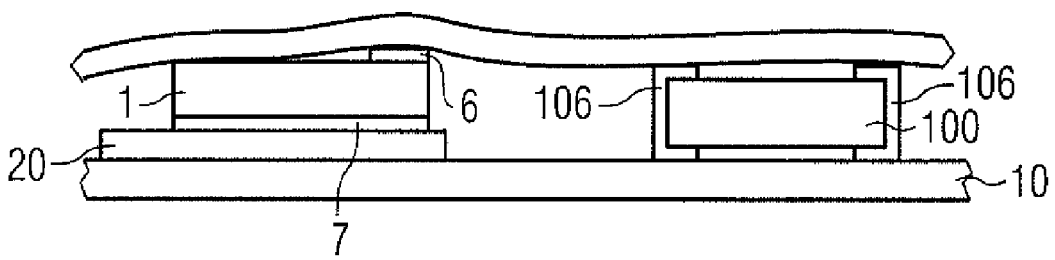
FIG. 14 shows a schematic sectional view of a method stage for production of the headlight illustrated in FIG. 5 in accordance with a second exemplary embodiment of the method.
Figure 15:
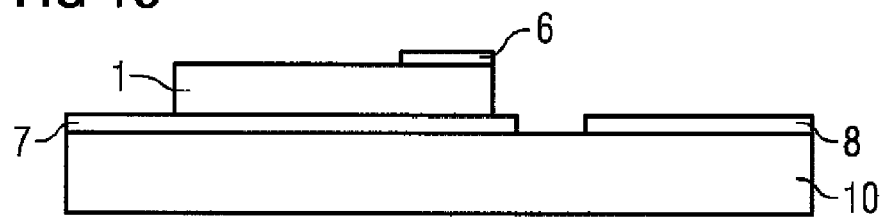
FIGS. 15 to 21 show schematic sectional views of different method stages of a third exemplary embodiment of the method for production of the optoelectronic headlight illustrated in FIG. 6.

An alternative variant of applying the insulation layer 3 as explained above with reference to FIG. 10 is illustrated in FIG. 14. In this case, the electrically insulating layer is prefabricated before being applied to the carrier body 10. By way of example, it is provided in the form of a flexible film that is subsequently applied to the components and the carrier body 10. The film can be applied by lamination or adhesive bonding for example using an adhesive. For the rest, the method can be carried out in the manner described above.

A further alternative variant of applying the insulation layer 3 is explained below in the context of the description of the exemplary embodiment of the method as illustrated with reference to FIGS. 15 to 18.

In contrast to the method explained above with reference to FIGS. 8 to 14, a carrier body 10 having two connection regions 7, 8 is provided. The electrical connection regions 7, 8 are electrically insulated from one another. They are formed by metal layers, for example, which are applied on a basic body of the carrier body 10. The carrier body 10 can be for example a PCB (printed circuit board), in particular an MCPCB.

A luminescence diode chip 1 is applied on the first connection region 7 and is electrically conductively connected to the connection region 7, which is done for example by applying that area of the luminescence diode chip which faces the connection region by soldering or adhesive bonding by means of a solder or an electrically conductive adhesive. On its side remote from the connection region 7, the luminescence diode chip 1 has an electrical connection pad 6. The luminescence diode chip 1 is an example of an optoelectronic component which is applied on the carrier body 10.

As an alternative, the optoelectronic component can also have a housing in which the luminescence diode chip 1, if appropriate together with the second luminescence diode chip 2 illustrated in FIG. 6, is mounted and, if appropriate, is also encapsulated. The housing can be suitable for example for SMD mounting.

FIGS. 15 to 21 correspond to illustrations of a section of the headlight illustrated in FIG. 6 along the broken line depicted in FIG. 6 during different method stages for production of the headlight. The sectional view illustrated in FIG. 21 corresponds to an illustration of the section through the finished headlight.

Figure 16:
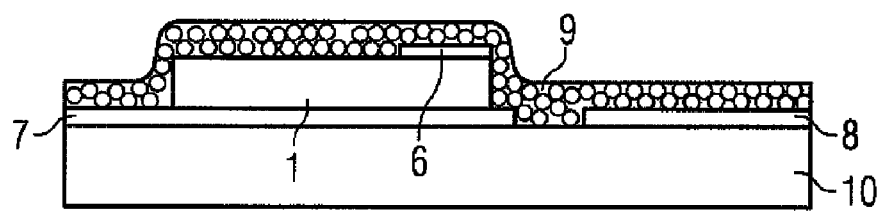
Figure 17:
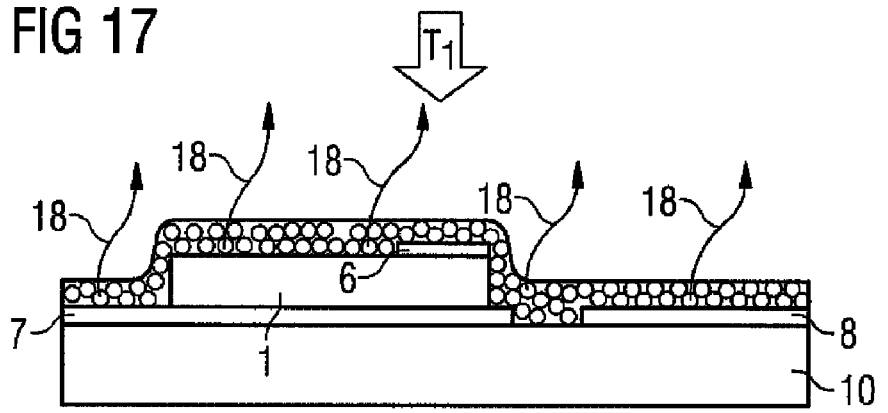

A precursor layer 9 containing both organic and inorganic constituents is applied to the carrier body 10 and the components applied thereon, see FIG. 16. The precursor layer is applied for example by means of a sol-gel method, by vapor deposition, sputtering, spraying or by spin-coating of a suspension.

The precursor layer is subsequently subjected to a first thermal treatment. In this case, it is left for example at a temperature $T_1$ of preferably approximately 200° C. to 400° C. for approximately four hours to eight hours in a neutral or slightly oxygen-containing atmosphere. By way of example, a pure nitrogen atmosphere or a neutral atmosphere having a low oxygen partial pressure is suitable for this purpose. During this first thermal treatment, organic constituents of the precursor layer 9 are removed, as is indicated by the arrows 18 in FIG. 17.

Figure 18:
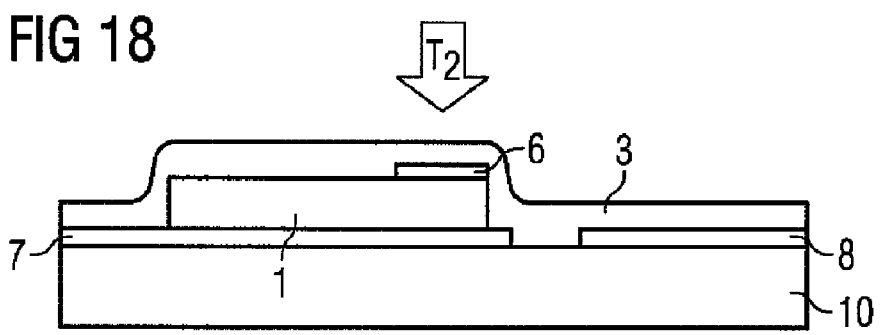

The resultant layer is subsequently densified by means of a second thermal treatment, as is illustrated schematically in FIG. 18, in order to produce the insulation layer 3. The second thermal treatment comprises sintering that is effected at a temperature $T_2$ of preferably approximately 300° C. to 500° C. for approximately four hours to five hours. The second thermal treatment is preferably carried out under a reducing or oxidizing atmosphere. Glass layers, in particular, can be produced by this method.

Figure 19:
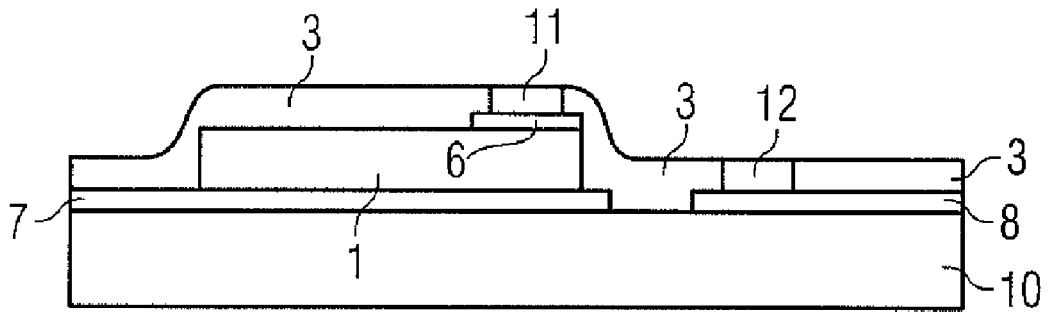
Figure 20:
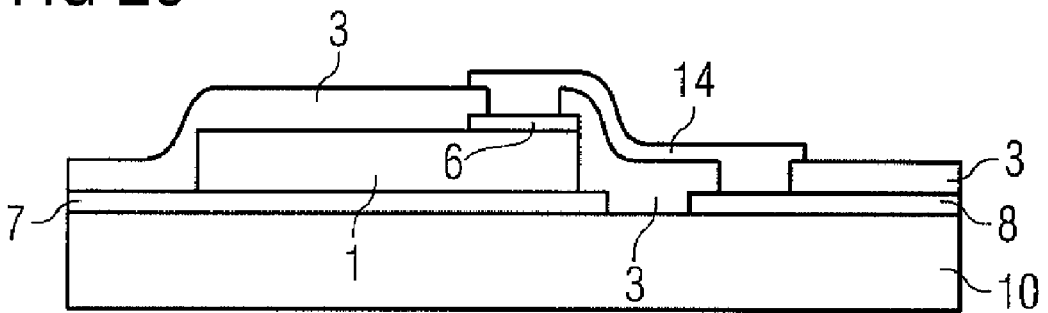
Figure 21:
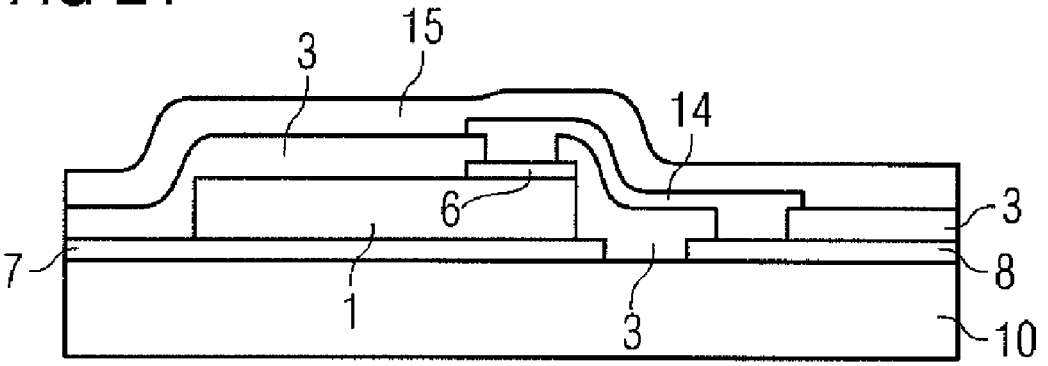

The insulation layer 3 thus produced is subsequently provided with cutouts 11, 12 in order to uncover partial regions of electrical connection pads 6 or electrical connection regions of the carrier body 8, see FIG. 19. Afterward, an electrically conductive material for forming a conductor track structure 14 is applied to the insulation layer 3, see FIG. 20. Afterward, an insulating cover layer 15 is optionally applied to the electrical conductive track structure 14, which is illustrated in FIG. 21.

The cover layer 15 can be produced in a manner analogous to the production of the insulation layer 3. It can in particular comprise a glass or consist of a glass. In this case, the method steps described above with reference to FIGS. 16 to 18 are preferably carried out a first time in order to produce an insulation layer 3, and repeated after the application of the conductor track structure 14 in order to form the cover layer 15.

By multiply repeating the application of an electrically insulating layer and an electrically conductive layer, it is also possible to realize a multilayered conductor track structure. This is advantageous, in particular, if a complex interconnection of a plurality of electrical components is to be realized in a confined space.

In the methods and optoelectronic headlights described, the insulation layer and/or the insulating cover layer can comprise a luminescence conversion material. The latter is present for example as at least one phosphor in the form of a powder. Suitable luminescence conversion materials are for example all converters known for application in LEDs.

Examples of such phosphors and phosphor mixtures suitable as converters are:
  chlorosilicates, as disclosed for example in DE 10036940 and the prior art described therein,
  orthosilicates, sulfides, thiometals and vanadates as disclosed for example in WO 2000/33390 and the prior art described therein,
  aluminates, oxides, halophosphates, as disclosed for example in U.S. Pat. No. 6,616,862 and the prior art described therein,
  nitrides, siones and sialones as disclosed for example in DE 10147040 and the prior art described therein, and
  garnets of rare earths such as YAG:Ce and the alkaline earth metal elements as disclosed for example in US 2004-062699 and the prior art described therein.

The invention is not restricted to the exemplary embodiments by the description of the invention on the basis of said exemplary embodiments. Rather, the invention encompasses any new feature and also the combination of features, which in particular comprises any combination of features in the patent claims, even if this feature or this combination itself is not explicitly specified in the patent claims or exemplary embodiments.

The invention claimed is:

1. An optoelectronic headlight which emits electromagnetic radiation, comprising:
  a luminescence diode chip having at least two emission regions, wherein the emission regions can be driven independently of one another and, in a plan view of a main extension plane associated with them, are shaped differently, are of different sizes and/or are not shaped rectangularly and are differently oriented, and
  the at least two emission regions are spaced apart from one another.

2. The headlight as claimed in claim 1,
  wherein the shape of at least one of the emission regions in a plan view of the main extension plane is not rectangular.

3. The headlight as claimed in claim 1, wherein
  the shape of at least one of the emission regions in a plan view of the main extension plane has a corner with an acute angle or with an obtuse angle.

4. The headlight as claimed in claim 1, wherein the shape of at least one of the emission regions in a plan view of the main extension plane has a bend with a reflex angle.

5. The headlight as claimed in claim 1, wherein, the shape of at least one of the emission regions in a plan view of the main extension plane has no axis of symmetry.

6. The headlight as claimed in claim 1, wherein adjacent emission regions are at a distance of less than or equal to 100 µm from one another.

7. The headlight as claimed in claim 1, wherein the luminescence diode chip or the luminescence diode chips is or are arranged on a carrier body and together with the carrier body covered with an electrical insulation layer on which an electrical conductor track structure is formed, wherein the emission regions each have at least one electrical connection pad connected to the conductor track structure.

8. The headlight as claimed in claim 7, wherein in addition to the luminescence diode chip or the luminescence diode chips, an electronic component is arranged on the carrier body, which component has at least one electrical connection pad which is electrically conductively connected to at least one connection pad of the emission regions via the conductor track structure.

9. The headlight as claimed in claim 8, wherein the electronic component is a passive component and/or an integrated circuit.

10. The headlight as claimed in claim 8, wherein the electronic component is suitable for SMD mounting.

11. The headlight as claimed in claim 7, wherein the connection pad of at least one emission region is electrically conductively connected to a connection region of the carrier body via the conductor track structure.

12. The headlight as claimed in claim 7, wherein the insulation layer contains a luminescence conversion material.

13. The headlight as claimed in claim 7, wherein, the luminescence diode chip or the luminescence diode chips is or are mounted on a chip carrier, wherein the chip carrier is applied on the carrier body.

14. A method for production of an optoelectronic headlight which emits electromagnetic radiation, comprising the steps of:
providing a carrier body and at least one luminescence diode chip which has at least two emission regions which can be driven independently of one another and which, in a plan view of a main extension plane associated with them, are shaped differently, are of different sizes and/or are differently oriented in the case of an identical type of shape, wherein each emission region has at least one electrical connection pad,
applying the luminescence diode chip on the carrier body,
applying an insulation layer to the luminescence diode chip and the carrier body,
forming cutouts in the insulation layer, for uncovering at least one respective electrical connection pad of the emission regions, and
applying electrically conductive material to the insulation layer in such a way that it is connected to the electrical connection pads, in order to form an electrical conductor track structure,
applying at least one electrical component on the carrier body before the insulation layer is applied,
applying the insulation layer in such a way that the electrical component is also covered,
forming cutouts in the insulation layer, in order to uncover the electrical connection pad of the component, and
applying electrically conductive material to the insulation layer in order to form an electrical conductor track structure, in such a way that the electrically conductive material is connected to the electrical connection pad of the component.

15. The headlight as claimed in claim 7, wherein the at least two emission regions are formed by a semiconductor layer sequence each having an active zone suitable for emitting electromagnetic radiation.

* * * * *